US006867633B2

(12) United States Patent
Godat

(10) Patent No.: US 6,867,633 B2
(45) Date of Patent: Mar. 15, 2005

(54) COMPLEMENTARY ELECTRONIC SYSTEM FOR LOWERING ELECTRIC POWER CONSUMPTION

(75) Inventor: Yves Godat, Cornaux (CH)

(73) Assignee: EM Microelectronic - Marin SA, Marin (CH)

(*) Notice: Subject to any disclaimer, the term of this patent is extended or adjusted under 35 U.S.C. 154(b) by 31 days.

(21) Appl. No.: 10/308,108

(22) Filed: Dec. 3, 2002

(65) Prior Publication Data

US 2003/0102853 A1 Jun. 5, 2003

(30) Foreign Application Priority Data

Dec. 4, 2001 (CH) .............................................. 2209/01

(51) Int. Cl.[7] .................................................. H03L 5/00

(52) U.S. Cl. ....................................... 327/306; 327/530

(58) Field of Search ......................... 327/112, 306–315, 327/530, 545, 546; 307/109, 110, 412; 331/176, 66; 326/85, 87, 88

(56) References Cited

U.S. PATENT DOCUMENTS 3,816,811 A * 6/1974 Cmelik ....................... 324/667
3,887,881 A 6/1975 Hoffmann ................... 330/277
3,937,001 A 2/1976 Berney ........................ 368/159
3,956,714 A 5/1976 Luscher ................ 331/116 FE
4,023,112 A 5/1977 Duncker et al. ............ 330/293
5,796,296 A * 8/1998 Krzentz ...................... 327/545
5,991,177 A 11/1999 Kaczkowski ................. 363/62
6,040,744 A * 3/2000 Sakurai et al. .............. 331/176
6,172,378 B1 * 1/2001 Hull et al. ..................... 257/14
6,515,903 B1 * 2/2003 Le et al. ................ 365/185.18
6,518,814 B1 * 2/2003 Majid et al. ................ 327/306

FOREIGN PATENT DOCUMENTS

EP 443507 A3 8/1991

* cited by examiner

*Primary Examiner*—Minh Nguyen
(74) *Attorney, Agent, or Firm*—Sughrue Mion, PLLC

(57) ABSTRACT

An electronic system with semiconductor components allows electronic circuits with conventional semiconductor components to be used, having minimal supply voltages to guarantee stable operation, lowering said minimum supply voltages. The range of supply voltages of such a circuit for which operation is stable can be extended towards low values by the effect of mutual compensation of the respective behaviors of said semiconductor components in their respective transition regions.

12 Claims, 5 Drawing Sheets

COMPLEMENTARY ELECTRONIC SYSTEM FOR LOWERING ELECTRIC POWER CONSUMPTION

BACKGROUND OF THE INVENTION

The present invention concerns an electronic system including at least a first electronic device with semiconductor components comprising at least an input terminal, an output terminal, a high supply terminal brought to a high potential $V_{DD}$, and a low supply terminal brought to a low potential $V_{SS}$, defining a supply voltage $V_{DD}-V_{SS}$, said system allowing the electric power consumption of certain conventional electric circuits to be lowered when said system is associated therewith.

Indeed, electronic circuits with semiconductor components have in particular the peculiarity of having different operating conditions as a function of the supply voltage that is applied to them. The user of such circuits generally wishes to be able to have a sufficiently broad range of use in terms of supply voltage to prevent, in particular, the risk of abrupt variations in the supply voltage. Consequently, the common fields of use of electronic circuits with semiconductor components are often precisely delimited within the low supply voltage region, as regards the ranges corresponding to stable operating conditions.

The electronics field is constantly searching for solutions for lowering the power consumption of circuits, particularly through a drop in the minimum permissible supply voltage for said circuits to operate in a stable manner. A solution that is currently used and regularly improved consists in modifying the physical features of the semiconductor components, such as their geometry, the nature of the doping agents used or their quantity, such that the value of their threshold voltage is lowered.

FIG. 1 shows, by way of non-limiting example, a common electronic circuit, more precisely a common type of amplification circuit 100 (gain equal to 1 here) and including, in particular, semiconductor elements (not shown). Amplification circuit 100 includes, in particular, two input terminals 101 and 102, an output terminal 103 and two supply terminals i.e. one high terminal 104 and one low terminal 105. Input terminal 101 is powered by an input signal $V_1$ whereas input terminal 102 is connected to output terminal 103 thus forming a feedback loop. Further, output terminal 103 is brought to an output potential $V_2$. High supply terminal 104 is connected to a high potential $V_{DD}$ whereas low supply terminal 105 is connected to a low potential $V_{SS}$.

FIG. 2 shows the behaviour of the amplification circuit or stage shown in FIG. 1 when the difference of potentials $V_{DD}-V_{SS}$ is varied by applying a potential V1 of constant amplitude to input 101. The ordinate scale on the curve of FIG. 2 corresponds to the ratio $V_2/V_1$ of the output voltage over the input voltage, in other words to the gain or the transfer function H2 of the amplification stage shown in FIG. 1. It will thus be noted that gain H2, whose value is negligible for low values of the difference of potentials $V_{DD}-V_{SS}$, 201, increases rapidly from the moment when the potential difference $V_{DD}-V_{SS}$ reaches a noted value $V_T$ which is the threshold voltage of the semiconductor components used in the construction of the amplification stage. The curve then defines a portion 202 constituting a transition zone in the behaviour of amplification stage 100. A last portion 203 will also be noted on the curve of gain H2 shown in FIG. 2, located after value $V_{C1}$, in the zone where the value of potential difference $V_{DD}-V_{SS}$ is considerably greater than $V_T$. In this last portion 203, the value of amplification gain H2 remains substantially constant. Generally, $V_{C1}$ corresponds to a value higher than 2 $V_T$ or 2.5 $V_T$.

It can thus easily be deduced from analysing FIG. 2 that an amplification stage such as that shown in FIG. 1 can be used as an amplifier with a constant gain H2, for different supply voltage values, provided that the latter are sufficiently higher than the threshold voltage of the semiconductor components used to be at the level of portion 203.

However, the solution consisting in modifying the physical features of the semiconductors often has the drawback of making the corresponding manufacturing process much more complex and thus more expensive than conventional processes.

SUMMARY OF THE INVENTION

The main object of the present invention is to improve the power consumption of electronic circuits with semiconductor components of the prior art while overcoming the aforementioned drawbacks of the prior art.

The invention therefore concerns an electronic system of the aforementioned type, characterised in that said electronic device has a transfer function H1 the graphic representation of which, as a function of said supply voltage, includes three successive fields, the first field ranging from the low values of $V_{DD}-V_{SS}$ to a value $V_T$, called the threshold value of the semiconductor components, said field corresponding to a high and substantially constant value of H1, the second field ranging from $V_T$ to a value $V_{C2}$, corresponding to a sharply sloping decrease in H1 and the third field extending beyond $V_{C2}$, corresponding to a low and substantially constant value of H1.

More precisely, a main object of the present invention is to provide an electronic system of the type described hereinbefore and whose output terminal at least is capable of being connected to a second electronic device with semiconductor components also powered by voltage $V_{DD}-V_{SS}$ and having a transfer function H2 the graphic representation of which, as a function of the supply voltage, includes three successive ranges, the first range ranging from low values of $V_{DD}-V_{SS}$ to a value $V_T$, called the threshold voltage of the semiconductor components, said first range corresponding to a low and substantially constant value of H2, the second range ranging from $V_T$ to a value $V_{C1}$, corresponding to a sharply sloping increase in H2 and the third range extending beyond $V_{C1}$, corresponding to a high and substantially constant value of H2, characterised in that said first electronic device has a transfer function H1 that varies as a function of the supply voltage $V_{DD}-V_{SS}$, such that the electronic system has a transfer function H3 that varies as a function of the supply voltage $V_{DD}-V_{SS}$ so as to be substantially constant from a value of supply voltage $V_{C3}$ lower than $V_{C1}$.

In order to reach this result, the first electronic device is preferably made such that it includes at least a capacitive type voltage division stage connected, on the one hand, to a first of said two supply terminals and, on the other hand, to said input terminal, said voltage division stage including at least one transistor made in SOI technology including a gate connected, in particular, to said output terminal of said first electronic device, a source and a drain connected to each other and connected to said first supply terminal, said first device also including means for polarising said transistor connected, on the one hand, to the second of said two supply terminals, and on the other hand, to the gate of said transistor.

This type of system is particularly well adapted when the second device described hereinbefore includes at least one electronic circuit taken from the group including amplifiers and oscillators with semiconductor components, insofar as these electronic circuits generally have transfer function curves of the type of that shown in FIG. 2.

Of course, those skilled in the art will know how to implement the system according to the invention, without any particular difficulty, to lower the power consumption of any semiconductor circuit other than those mentioned hereinbefore and having a feature of the type described hereinbefore.

In a preferred embodiment, the first device further includes a second output terminal, a second capacitive type voltage division stage connected, on the one hand, to the second of said two supply terminals and, on the other hand, to said input terminal, the second voltage division stage comprising at least a second SOI type transistor whose type of doping agent is different to that of the transistor of said first stage and including a gate connected, in particular, to said second output terminal, a source and a drain connected to each other and connected to said second supply terminal, said second device also including means for polarising the second transistor connected, on the one hand to the first of said two supply terminals, and on the other hand, to the gate of said second transistor.

In this case, the input terminal of the second electronic device can be connected either to the first or the second of the two outputs of the first electronic device. The electronic system according to the invention may also include a third electronic device including an electronic circuit taken from the same group as that of the electronic circuit of the second device and connected to the other of the outputs of the first electronic device.

In a preferred variant of the preceding embodiment, an output stage can be added between the output terminals of the second and third devices and the output terminal of the complete system, said output stage assuring the recombination of the signals respectively delivered by said two output terminals.

One will consider, by way of illustrative example, a particular case of the different embodiments which have just been described wherein the electronic circuit employed in the second device is a conventional amplifier as shown in FIG. 1. As a result of its features, the electronic system according to the invention thus allows a signal to be amplified with a constant gain while lowering the necessary difference between the high and low supply potentials, i.e. the supply voltage of the circuit, thus reducing the power consumption of said circuit. Indeed, in order to operate in amplification mode, the transistors present in the amplification stages have to be biased with a voltage more or less equal to a particular value, called the threshold voltage. This threshold voltage generally varies from one transistor to another as a function of their respective geometrical and physical parameters. The transfer curve of a transistor used in an amlification mode, as a function of its polarisation voltage, has a transition zone around the threshold voltage. Consequently, an amplification stage with transistors has a gain that varies when the circuit supply voltage varies around the threshold voltage. When the value of the circuit supply voltage sufficiently exceeds the value of the threshold voltage, the gain procured by the amplification stage becomes constant. Typically, the constant gain amplifiers of the prior art are thus powered with supply voltages considerably far from the corresponding threshold voltage in order to avoid the aforementioned problems.

The electronic system according to the present invention includes, in a first electronic device, a voltage divider circuit including capacitive elements of variable capacitance for taking account of and even compensating for the variation in the amplification gain of the electronic circuit used in the second device as a function of the supply voltage, in the transition zone of the transistors used. More precisely, when the system supply voltage increases from the value of the threshold voltage, the gain of an amplification circuit increases significantly. At the same time, the value of the variable capacitance also increases, in the same proportions, such that the outgoing signal from the voltage divider stage entering the amplification circuit has a lower amplitude. Thus, one can obtain a global gain for the system that does not vary with its supply voltage, by a simple compensation effect between the voltage divider and amplification circuits.

The system according to the present invention becomes particularly advantageous when the capacitive elements are made in the form of transistors, in particular in Silicon on Insulator (SOI) type technology. Indeed, the capacitance of an SOI transistor varies significantly as a function of the polarisation voltage that is applied thereto. When said polarisation voltage is less than or equal to threshold voltage $V_T$ of the transistor, its capacitance is low while it increases quickly, when said polarisation voltage increases from $V_T$ to reach a higher constant value beyond a certain value of the polarisation voltage. Thus, it is possible to adjust the physical features of these capacitive elements with variable capacitance such that their behaviour, as a function of the supply voltage applied to the system, compensates for the transitory behaviour of the elements involved in the amplification circuit. It is thus possible, in accordance with the present invention, to supply the system with a lower voltage than in the case of the amplification circuits of the prior art, while keeping a constant value for the amplification gain.

BRIEF DESCRIPTION OF THE DRAWINGS

The invention will be better understood using the following description of an example embodiment made with reference to the annexed drawings, in which.

DETAILED DESCRIPTION OF THE INVENTION

Figure 1:
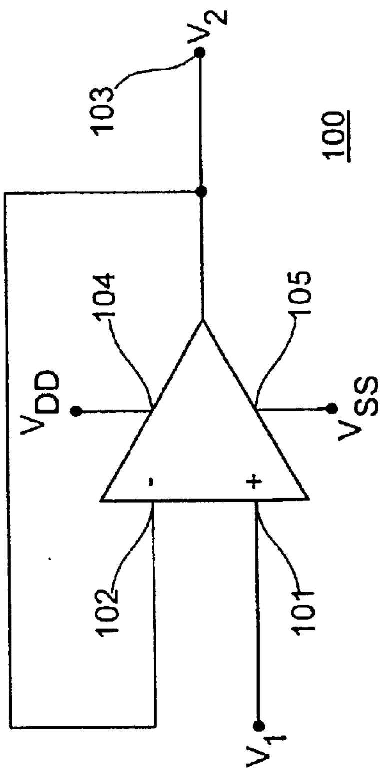
Fig. 1 (PRIOR ART)
FIG. 1 shows a simple amplification stage, powered by a supply voltage $V_{DD}-V_{SS}$ as known from the prior art.
Figure 2:
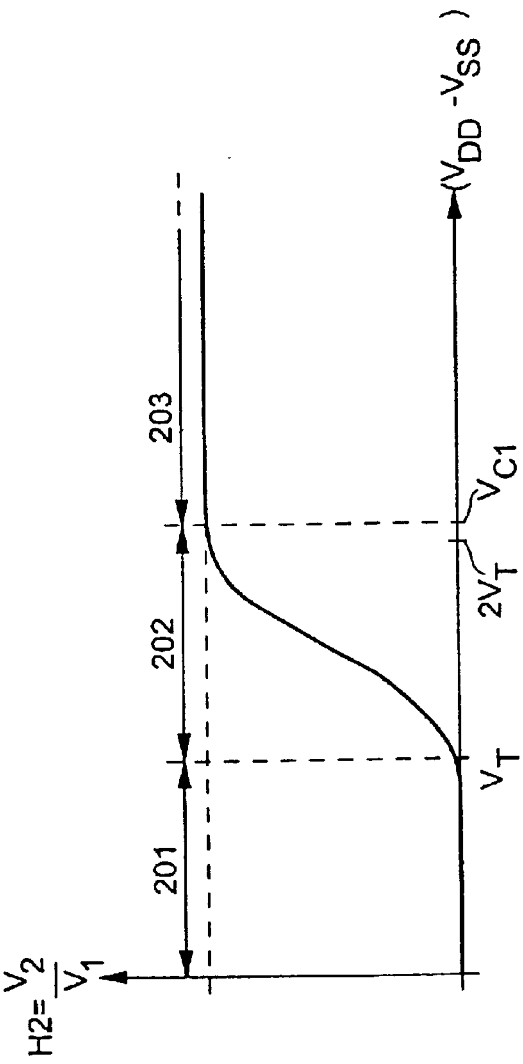
Fig. 2 (PRIOR ART)
FIG. 2 shows the curve describing the behaviour of the amplification factor H2 of the amplification stage shown in FIG. 1, as a function of the supply voltage that is applied thereto.

As described hereinbefore, the present invention brings a solution combining a conventional electronic circuit, like for example amplification circuit 100 shown in FIG. 1, with an additional electronic device such that portion 203 of FIG. 2 starts from a value $V_{C3}$ (shown in FIG. 8) lower than $V_{C1}$, or lower than $2V_T$. Thus, for a given amplification circuit and amplification gain H2, the user of the complete system according to the present invention can use a lower supply potential difference than in the case of the amplification circuits of the prior art. This feature advantageously allows less power to be consumed for a given amplification gain than with a circuit of the prior art.

The basic principle on which the present invention rests consists in limiting the amplitude of the incoming signal into the amplification circuit as a function of the supply voltage and the corresponding increase in amplification gain H2. Thus, for two different supply voltage values, taken in portion 202 of FIG. 2, the gain of amplification stage H2 is fixed at two different values and the amplitude of the signal to be amplified is consequently attenuated differently in these two cases in accordance with the invention, such that the overall gain H3 of the complete amplification system is the same for said two supply voltage values.

In practice, in order to carry out this amplitude limitation of the incoming signal in the amplification circuit, one can for example use a capacitive type voltage divider bridge as an additional electronic device. In such case, one of the capacitive elements forming said divider bridge can have a variable capacitance, and in particular this may depend directly on the value chosen for the circuit supply voltage.

In a preferred embodiment of the invention, a transistor is used, occupying less space on an integrated circuit than a conventional capacitor, to perform the function of said variable capacitance element. In fact, a transistor whose source and drain are short-circuited behave like a capacitor whose capacitance fluctuates as a function of the polarisation voltage that is applied thereto. Generally, this latter feature is perceived as a drawback within the electronic chip manufacturing field, insofar as it delimits a range of use for the transistor as a capacitor, in terms of supply voltage.

The curve corresponding to the behaviour of the capacitance of a transistor, as a function of the polarisation voltage that is applied thereto, has the same general shape as the curve shown in FIG. 2. In this case, portion 201 of said curve would correspond to a low value Cb of the capacitance, portion 202 would correspond to the transition zone and portion 203 would correspond to a high value Ch of the capacitance.

Generally, the ratio Ch/Cb rarely reaches 2 for a transistor made in CMOS technology (Complementary Metal Oxide Semiconductor) whereas it can reach values as high as 15 for a transistor made in SOI technology (Silicon On Insulator). These two types of transistors can be employed to implement the present invention, but it is clear than a transistor made in SOI technology offers greater flexibility of use.

Figure 3:
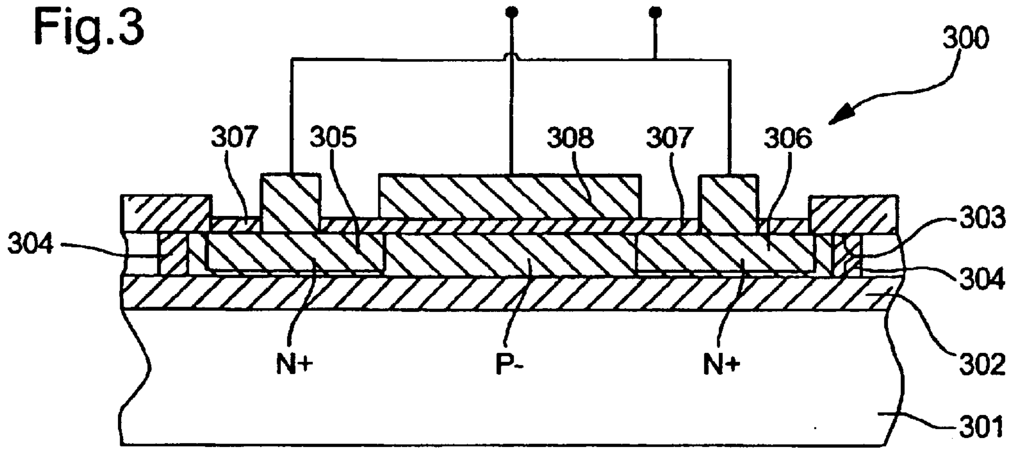
FIG. 3 shows a cross-section of an embodiment example of an SOI transistor according to the present invention.

FIG. 3 shows a cross-section of an embodiment example of such an SOI type transistor 300, as disclosed in U.S. Pat. No. 6,172,378, to which the interested reader may refer to obtain further details.

FIG. 3 shows the simplified conventional structure of a chip made in SOI technology, namely a substrate 301, on which an insulated layer 302, made for example of silicon dioxide, is arranged, and on which is arranged a silicon layer 303 used for integrating the components. Trenches 304 filled with insulator are disposed around a region of said chip in which said transistor 300 is integrated. Silicon layer 303 is doped with different doping agents depending on the location. Two metal contacts are disposed at the surface of said region, in contact with N+ doped regions of the second silicon layer, defining source 305 and drain 306 of transistor 300. The free portions of the second silicon layer are covered with a thin layer of oxide 307, on which an N doped silicon layer is deposited between the source and the drain, so as to form gate 308 of the transistor.

When this transistor 300 is used as a capacitor, source 305 and drain 306 are short-circuited thus forming a first terminal of the capacitor whereas gate 308 forms the second terminal of said capacitor. It is clear, upon observing FIG. 3, that as a function of the voltage applied to said terminals of said capacitor, the physical properties of the channel (here of the P-type, located in layer 303) of the transistor are modified, causing a modification in the corresponding capacitance value.

Of course, the description of the transistor which precedes also applies to a P type transistor having a similar structure to that visible in FIG. 3 with only slight differences, particularly as regards the doping regions.

Figure 4A:
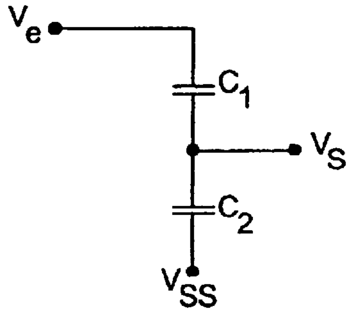
Fig.4a (Prior art)
FIG. 4*a* shows an electric diagram of a conventional capacitive type voltage divider bridge including two capacitors.

FIG. 4*a* shows an electric diagram of a simple voltage divider bridge, of the capacitive type, including two conventional capacitors with respective capacitances C1 and C2, hereinafter respectively referenced capacitor C1 and capacitor C2. Capacitor C1 is connected, on the one hand, to an input terminal through which an input signal Ve is applied, and on the other hand, to a first terminal of capacitor C2 whose second terminal is connected to a fixed potential VSS. An output terminal is disposed between the two capacitors through which the output signal VS is recuperated. By a simple calculation, one can determine the transfer function k of this circuit which has a value:

$$k=V_S/V_e=C_1/(C_1+C_2).$$

Figure 4B:
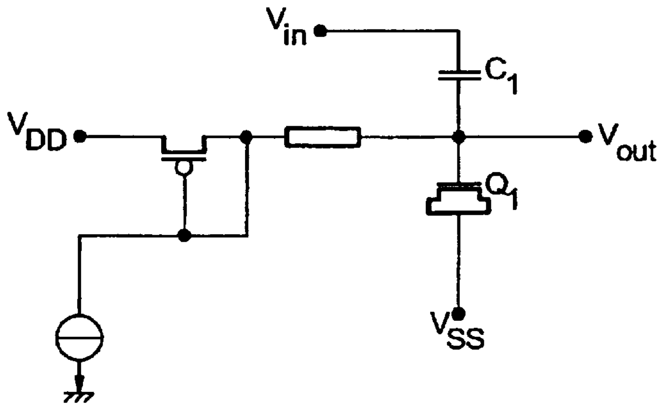
FIG. 4*b* shows an electric diagram of a voltage divider stage according to the present invention including, particularly, the transistor shown in FIG. 3.

FIG. 4*b* shows an electric diagram of a similar voltage divider bridge to that of FIG. 4*a*, wherein capacitor $C_2$ has been replaced by a transistor $Q_1$, so as to form a capacitor with a capacitance $C_{T1}$, like that shown in FIG. 3. It will be noted that an additional part appears in the diagram of FIG. 4*b*, corresponding to a conventional polarisation circuit of the transistor, which will not be described in more detail in the present Application. For this circuit, the transfer function H1 becomes:

$$H1=V_S/V_e=C_1/(C_1+C_{T1}).$$

As was mentioned hereinbefore, when the potential difference $V_{DD}-V_{SS}$ varies, the value of $C_{T1}$ varies and thus the value of H1 also varies.

Figure 5:
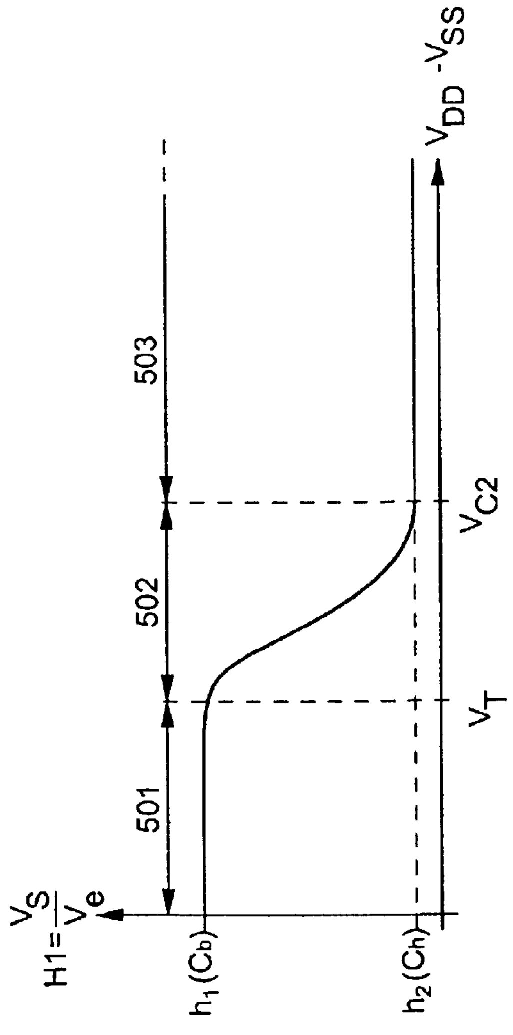
FIG. 5 shows the ratio of the output voltage over the input voltage of the voltage divider stage shown in FIG. 4, as a function of the supply voltage applied to the circuit.

FIG. 5 shows the curve giving the behaviour of H1 as a function of $V_{DD}-V_{SS}$ for a fixed input voltage value $V_e$. It will be noted that for the values of $V_{DD}-V_{SS}$ lower than $V_T$, which corresponds to a non conducting state for transistor $Q_1$, the transfer function H1 of the voltage divider bridge is constant and equal to value h1. It can also be noted that when the value of $V_{DD}-V_{SS}$ increases from $V_T$ to a value referenced $V_{C2}$, which corresponds to the transition region of transistor Q1, the value of H1 gradually decreases until it is again constant and equal to a value $h_2$ after $V_{C2}$, when the transistor is in the steady-state conditions. Three portions can thus be distinguished in the curve of FIG. 5, portion 501 corresponding to the values of $V_{DD}-V_{SS}$ lower than $V_T$, portion 502 corresponding to the values of $V_{DD}-V_{SS}$ comprised between $V_T$ and $V_{C2}$ and portion 503 corresponding to the values of $V_{DD}-V_{SS}$ higher than $V_{C2}$.

It is possible to define more or less precisely the operating features of the semiconductor components, such as transistor $Q_1$ or amplification circuit 100, from the physical features of these components, adjusted during their manufacture. Consequently, it is also possible to define these physical features such that the threshold voltages $V_T$ are substantially the same for transistor $Q_1$ and for the components of amplification circuit 100 and such that $V_{C1}$ is substantially equal to $V_{C2}$. Thus, portions 202 of the curve shown in FIG. 2 and 502 of the curve shown in FIG. 5 are superposed and the progressive increase in the amplification circuit gain is at least partially compensated for by the progressive decrease in amplitude of the outgoing signal from the voltage divider circuit. In this way, the transfer function of the complete system, including in succession, said voltage divider circuit and the amplification circuit, has a substantially constant value over a large part of the range of values of $V_{DD}-V_{SS}$ corresponding to the transition region conditions of the semiconductor components. It is also easier to adjust the capacitance value of the capacitor with a high level of precision such that the compensation is almost perfect at least in the last part of the portion of curve 202 located beside portion 203.

Figure 6:
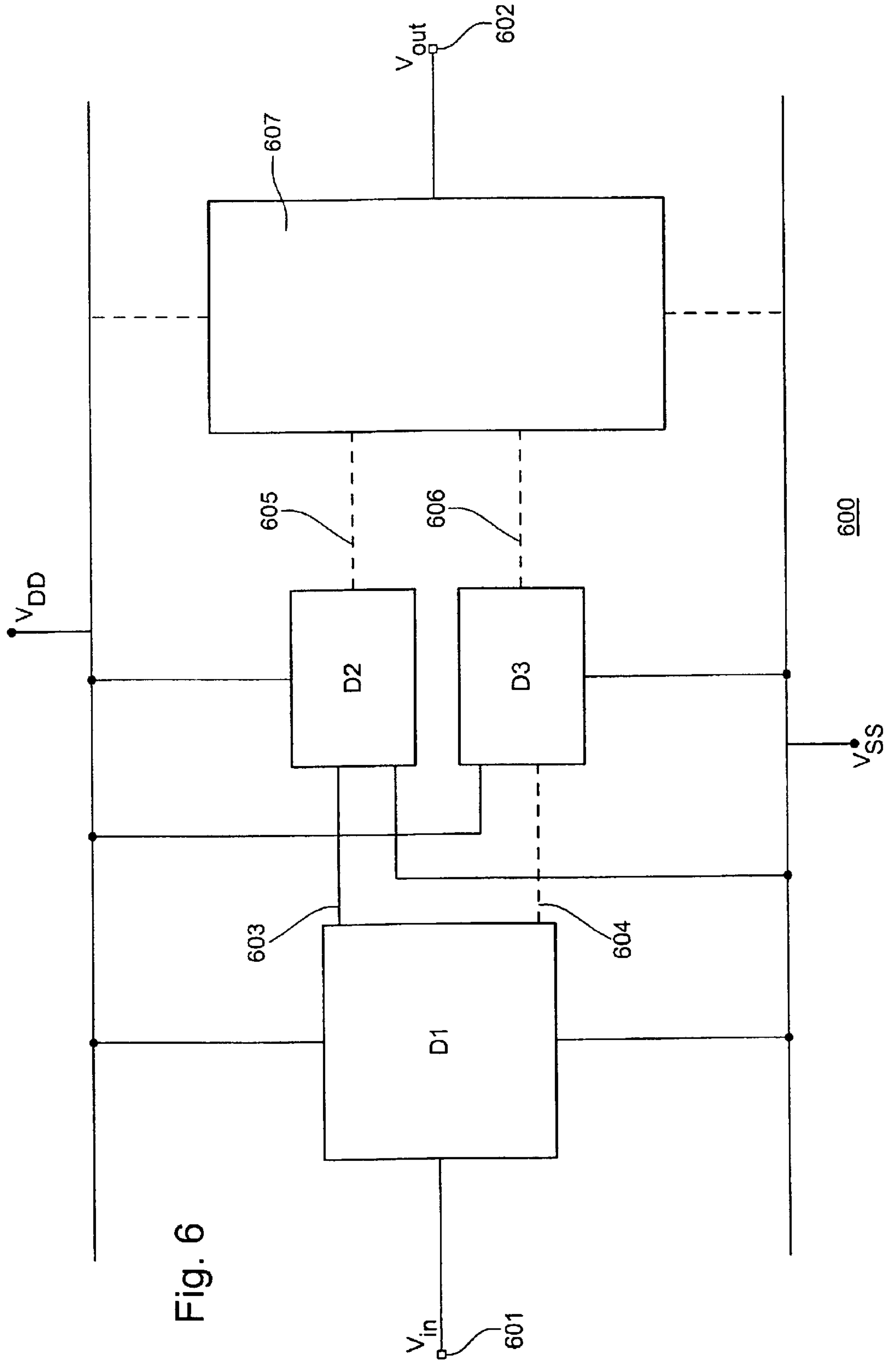
FIG. 6 shows a schematic diagram defining the general structure of the electronic system according to the present invention.

This peculiarity allows a general structure to be defined for electronic system 600 according to the present invention, shown in FIG. 6. Said electronic system 600 includes at least one input terminal 601 capable of receiving an input signal $V_{in}$, an output terminal 602 delivering an output signal $V_{out}$, a high supply terminal brought to a potential $V_{DD}$ and a low supply terminal brought to a potential $V_{SS}$. The system further includes a first electronic device, referenced D1, connected in particular to input terminal 601 of system 600 and to said supply terminals. Device D1 includes, in particular, an electronic circuit of the type having a similar feature to that shown in FIG. 5, thus for example, at least one voltage divider stage like that shown in FIG. 4*b*. Device D1 further includes an output terminal 603 connected to a second electronic device, designated by the reference D2 and connected to the supply terminals of system 600. Device D2 includes, in particular, an electronic circuit of the type having a similar feature to that shown in FIG. 2, thus for example, an amplification stage like that shown in FIG. 1, or even a conventional type of oscillator (not shown).

Electronic system 600 can also include a third electronic device, designated D3, connected to a second output terminal 604 of first electronic device D1 and to the supply terminals of system 600. Device D3 includes an electronic circuit of the same type as that described hereinbefore in relation to second electronic device D2 and device D1 preferably includes an additional electronic circuit also having a similar feature to that shown in FIG. 5. In this case, devices D2 and D3 respectively include at least one output terminal, respectively designated by the reference numerals 605 and 606, defining two output terminals for system 600. It is however possible to add an output stage 607, possibly connected to the supply terminals of system 600, for carrying out the combination of the signals originating from output terminals 605 and 606, so as to define a single output signal $V_{out}$.

Figure 7:
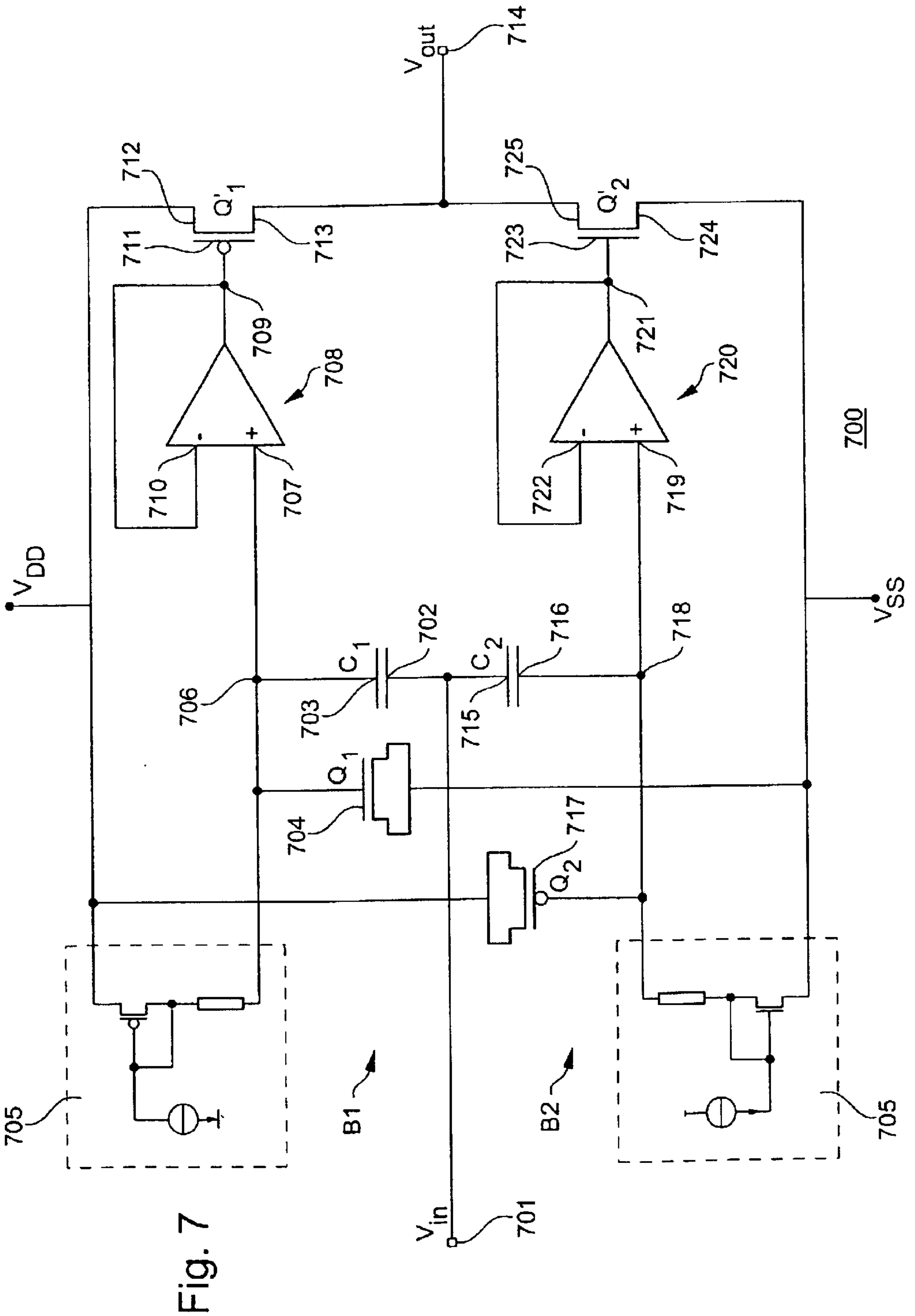
FIG. 7 shows the electric diagram of a simple embodiment example of the electronic system according to the present invention.

The general structure of the electronic system shown in FIG. 6 has been advantageously used to design the electronic system 700 ensuring constant gain amplification in accordance with the embodiment of the invention shown in FIG. 7. It is important to note that the embodiment example shown in FIG. 7 has deliberately been chosen for its simplicity so as to show the essential features of the present invention. In the embodiment described here solely by way of illustration, the constant gain amplification system includes two sub-circuits designated $B_1$ and $B_2$ both having main input 701 of the system as their input.

The input of sub-circuit $B_1$ is connected to a first terminal 702 of a capacitor $C_1$ whose second terminal 703 is connected to gate 704 of an N type transistor $Q_1$, and preferably similar to that shown in FIG. 3. Gate 704 of transistor $Q_1$ is also connected to polarisation means 705, like those shown in FIG. 4*b* for example. The source and the drain of transistor $Q_1$ are short-circuited and connected to low potential $V_{SS}$ of a power source (not shown). Capacitor $C_1$ and transistor $Q_1$ which here performs the function of a capacitor, thus form a capacitive voltage divider bridge whose output 706, located between said second terminal 703 of said capacitor and the gate 704 of transistor $Q_1$ is connected to a first input 707 of an amplification stage 708 like the one shown in FIG. 1. The output 709 of said amplification stage 708 is connected to second input 710 so as to form a feedback loop and it is further connected to gate 711 of a second P type transistor $Q'_1$. The source 712 of transistor $Q'_1$ is connected to high potential $V_{DD}$ of the power source whereas its drain 713 is connected to the output terminal 714 of the amplification system.

The structure of sub-circuit $B_2$ has a certain symmetry with respect to that of sub-circuit $B_1$. In fact, input 701 of sub-circuit $B_2$ is connected to a first terminal 715 of a capacitor $C_2$ the second terminal 716 of which is connected to the gate 717 of a P type transistor $Q_2$ that is preferably symmetrical with respect to transistor $Q_1$. Gate 717 of transistor $Q_2$ is also connected to polarisation means 705 like transistor $Q_1$. The source and the drain of transistor $Q_2$ are short-circuited and connected to high potential $V_{DD}$ of the power source. Capacitor $C_2$ and transistor $Q_2$, which here performs the function of a capacitor, thus form a capacitive voltage divider bridge whose output 718, located between said second terminal 716 of said capacitor and the gate 717 of the transistor, is connected to a first input 719 of a similar amplification stage 720 to that used in sub-circuit $B_1$. Output 721 of said amplification stage is connected to second input 722 so as to form a feedback loop and is further connected to gate 723 of a fourth N type transistor $Q'_2$. The source 724 of transistor $Q'_2$ is connected to low potential $V_{SS}$ of the power source whereas its drain 725 is connected to the output terminal 714 of the amplification system.

It should be noted that the respective amplification stages 708 and 720 are here shown as follower circuits for reasons of simplicity, but of course, those skilled in the art will have no difficulty in adapting these stages so as to obtain amplification stages with predefined gains.

An input signal $V_{in}$ of amplification system 700 according to the invention is divided into two components $S_1$ and $S_2$ respectively simultaneously processed by said two sub-circuits $B_1$ and $B_2$. Since supply voltage $V_{DD}-V_{SS}$ is fixed for example at $4V_T$, $V_T$ being the threshold voltage preferably common to all the transistors employed in the amplification circuit, the components $S_1$ and $S_2$ are attenuated by passing into the respective voltage divider bridges. The corresponding fractions of components $S_1$ and $S_2$ are then respectively injected into the first inputs of the respective amplification stages to be amplified therein. The corresponding amplified fractions of said components $S_1$ and $S_2$ are then combined through, respectively, transistors $Q'_1$ and $Q'_2$ to give, at the output of amplification system 700, a single output signal $V_{out}$ corresponding simply to the amplified input signal with an amplification gain H3.

According to the preceding description of curve 2, it will be realised that if one now fixes the supply voltage of a supply circuit in accordance with the prior art at $2V_T$, the operating point of the system is located in transition region 202 and the amplification gain of the system is no longer the same except for a supply voltage of $4V_T$.

However, owing to the features of the amplification system according to the invention, a supply voltage even slightly less than $2V_T$ is sufficient to obtain an amplification gain H3 substantially equal to the gain obtained with a supply voltage fixed at $4V_T$, for example.

Figure 8:
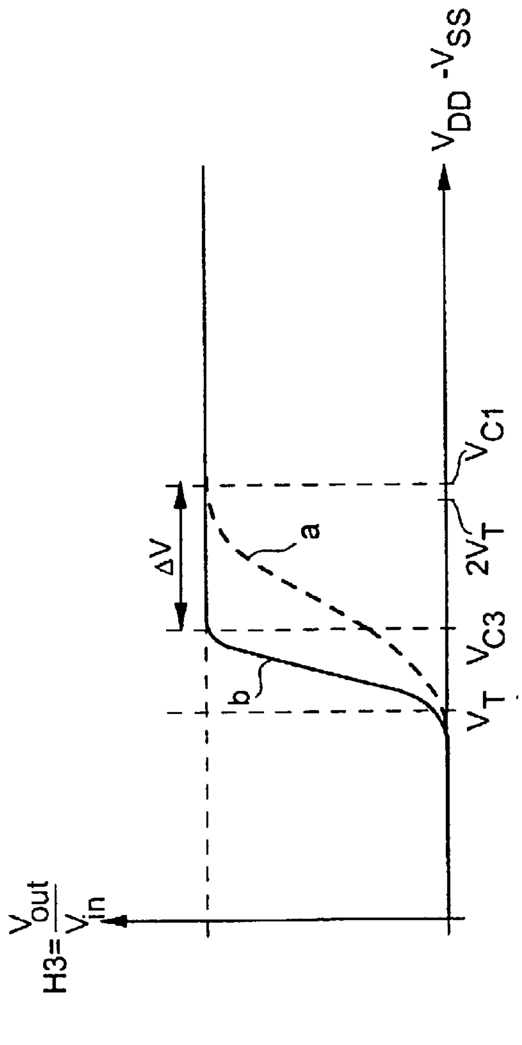
FIG. 8 shows the behaviour of the transfer function of the electronic system shown in FIG. 7 as a function of the supply voltage applied to said system and compared to the behaviour of an electronic circuit of the prior art.

This result is apparent from curves a and b shown in FIG. 8 showing the behaviour of amplification gain H3 as a function of the variation in the supply voltage of the amplification system, respectively according to the prior art and according to the present invention.

As was mentioned hereinbefore, it can be seen in curve a of FIG. 8 that the amplification gain of the circuit according to the prior art becomes constant from a value of $V_{DD}-V_{SS}$ greater than $V_{C1}$ which is greater than $2V_T$ here. Further, it will be noted on curve b of FIG. 8 that the amplification gain according to the present invention becomes constant from a value of $V_{DD}-V_{SS}$ greater than $V_{C3}$ which is less than $2V_T$ here.

Consequently, it can be deduced that the advantage in terms of supply voltage for the amplification system according to the invention with respect to the circuits of the prior art has a value of $\Delta V=V_{C1}-V_{C3}$.

Concretely, this advantage means a saving of the order of 0.5 to 1 volt on the supply voltage for the amplification system according to the present invention, which makes it particularly well suited for applications requiring low power consumption, such as in portable apparatuses.

The preceding description relates to a preferred embodiment of the invention and should in no way be considered as limiting, as regards for example the nature of the elements used to amplify the signal, the type of technology employed to integrate the components or the components employed at the output of the amplification stages for combining the signals originating from the two sub-circuits $B_1$ and $B_2$ to obtain a single output signal $V_{out}$.

It is of course possible to take advantage of the teaching of the present invention to perform asymmetrical amplification of an input signal by choosing for example to fix the respective gains of the two amplification stages at different values.

The possible applications of the electronic system according to the invention are numerous and those skilled in the art will of course know how to make any necessary adaptations to integrate it into a more general system, such as in an oscillator circuit for example. One could particularly envisage the use of such a system to make an oscillator for regulating the working of an electromechanical watch powered by a microgenerator, for example of the type disclosed in Patent document Nos. CH 597 636, EP 0 239 820 or EP 0 679 968.

What is claimed is:

1. An electronic system including at least a first electronic device D1 with semiconductor components, at least an input terminal, an output terminal, a high supply terminal brought to a high potential $V_{DD}$, and a low supply terminal brought to a low potential $V_{SS}$, defining a supply voltage $V_{DD}-V_{SS}$, wherein said electronic device D1 has a transfer function H1 the graphic representation of which as a function of said supply voltage includes three successive ranges, the first range ranging from low values of $V_{DD}-V_{SS}$ to a value $V_T$, called the threshold voltage of the semiconductor components, said first range corresponding to a value h1 of H1 that is high and substantially constant, the second range ranging from $V_T$ to a value $V_{C2}$, corresponding to a sharply sloping decrease in H1 and the third range extending beyond $V_{C2}$, corresponding to a value h2 of H1 that is low and substantially constant, wherein said first device D1 includes at least a capacitive type voltage divider stage connected on the one hand to a first of said two supply terminals and on the other hand, to said input terminal, and wherein said voltage divider stage includes at least a capacitive element with variable capacitance, wherein said capacitive element with variable capacitance is a transistor including a gate connected to said output terminal of said first electronic device D1, a source and a drain connected to each other and connected to said first supply terminal, wherein said transistor is made in SOI technology, wherein said first device D1 also includes polarisation means for said transistor connected on the one hand to the second of said two supply terminals and on the other hand to the gate of said transistor, and wherein said transistor is of the N type and wherein its source and its drain are connected to said low supply terminal.

2. An electronic system including at least a first electronic device D1 with semiconductor components, at least an input terminal, an output terminal, a high supply terminal brought to a high potential $V_{DD}$, and a low supply terminal brought to a low potential $V_{SS}$, defining a supply voltage $V_{DD}-V_{SS}$, wherein said electronic device $D_1$ has a transfer function H1 the graphic representation of which as a function of said supply voltage includes three successive ranges, the first range ranging from low values of $V_{DD}-V_{SS}$ to a value $V_T$, called the threshold voltage of the semiconductor components, said first range corresponding to a value h1 of H1 that is high and substantially constant, the second range ranging from $V_T$ to a value $V_{C2}$, corresponding to a sharply sloping decrease in H1 and the third range extending beyond $V_{C2}$, corresponding to a value h2 of H1 that is low and substantially constant, wherein said first device D1 includes at least a capacitive type voltage divider stage connected on the one hand to a first of said two supply terminals and on the other hand, to said input terminal, and wherein said voltage divider stage includes at least a capacitive element with variable capacitance, wherein said capacitive element with variable capacitance is a transistor including a gate connected to said output terminal of said first electronic device D1, a source and a drain connected to each other and connected to said first supply terminal, wherein said transistor is made in SOI technology, wherein said first device D1 also includes polarisation means for said transistor connected on the one hand to the second of said two supply terminals and on the other hand to the gate of said transistor, and wherein said transistor is of the P type and in that its source and its drain are connected to said high supply terminal.

3. An electronic system including at least a first electronic device D1 with semiconductor components, at least an input terminal, an output terminal, a high supply terminal brought to a high potential $V_{DD}$, and a low supply terminal brought to a low potential $V_{SS}$, defining a supply voltage $V_{DD}-V_{SS}$, wherein said electronic device $D_1$ has a transfer function H1 the graphic representation of which as a function of said supply voltage includes three successive ranges, the first range ranging from low values of $V_{DD}-V_{SS}$ to a value $V_T$, called the threshold voltage of the semiconductor components, said first range corresponding to a value h1 of H1 that is high and substantially constant, the second range ranging from $V_T$ to a value $V_{C2}$, corresponding to a sharply sloping decrease in H1 and the third range extending beyond $V_{C2}$, corresponding to a value h2 of H1 that is low and substantially constant, wherein said first device D1 includes at least a capacitive type voltage divider stage connected on the one hand to a first of said two supply terminals and on the other hand, to said input terminal, and wherein said voltage divider stage includes at least a capacitive element with variable capacitance, wherein said capacitive element with variable capacitance is a transistor including a gate connected to said output terminal of said first electronic device D1, a source and a drain connected to each other and connected to said first supply terminal, wherein said transistor is made in SOI technology, wherein said first device D1 also includes polarisation means for said transistor connected on the one hand to the second of said two supply terminals and on the other hand to the gate of said transistor, and wherein said first device D1 further includes a second output terminal, a second capacitive type voltage divider stage connected on the one hand to the second of said two supply terminals and on the other hand to said input terminal, wherein said second voltage divider stage includes at least a second SOI type transistor whose doping type is different from that of the transistor of said first stage and including a gate connected to said second output terminal, a source and a drain connected to each other and connected to said second supply terminal and wherein said first device D1 also includes polarisation means for said second transistor connected on the one hand to the first of said two supply terminals and on the other hand to the gate of said second transistor.

4. The electronic system according to claim 3, wherein said transistor of the first voltage divider stage is of the N type, its source and its drain being connected to the low supply terminal and its polarisation means being connected to the high supply terminal whereas said second transistor of said second voltage divider stage is of the P type, its source and its drain being connected to the high supply terminal and its polarisation means being connected to the low supply terminal and wherein the polarisation means for the transistor of said first voltage divider stage include a current source and a P type transistor whose gate and source are connected to each other and simultaneously connected to a first terminal of said current source and to said high supply terminal, the second terminal of said current source being connected to said low supply terminal, and wherein the polarisation means of the second transistor of said second voltage divider stage include a current source and an N type transistor whose gate and drain are connected to each other and connected simultaneously to a first terminal of said current source and to said low supply terminal, the second terminal of said current source being connected to said high supply terminal.

5. The electronic system according to claim 4, further including an output stage comprising two input terminals and an output terminal, said two input terminals being respectively connected to said two output terminals of said first electronic device D1 so as to deliver to the output terminal of said output stage a signal corresponding to the recombination of the signals delivered by said two respective terminals of the first electronic device D1.

6. The electronic system according to claim 3, further including an output stage comprising two input terminals and an output terminal, said two input terminals being respectively connected to said two output terminals of said first electronic device D1 so as to deliver to the output terminal of said output stage a signal corresponding to the recombination of the signals delivered by said two respective terminals of the first electronic device D1.

7. An electronic system including at least a first electronic device D1 with semiconductor components including at least one input terminal, an output terminal, a high supply terminal brought to a high potential $V_{DD}$, and a low supply terminal brought to a low potential $V_{SS}$, defining a supply voltage $V_{DD}-V_{SS}$, the output terminal at least being capable of being connected to a second electronic device D2 with semiconductor components also powered by the supply voltage $V_{DD}-V_{SS}$ and having a transfer function H2 the graphic representation of which as a function of the supply voltage includes three successive ranges, the first range ranging from low values of $V_{DD}-V_{SS}$ to a value $V_T$, called the threshold voltage of the semiconductor components, said first range corresponding to a low and substantially constant value of H2, the second range ranging from $V_T$ to a value $V_{C1}$, corresponding to a sharply sloping increase in H2 and the third range extending beyond $V_{C1}$, corresponding to a high and substantially constant value of H2, said first electronic device D1 having a transfer function H1 that varies as a function of the supply voltage $V_{DD}-V_{SS}$, such that the electronic system has a transfer function H3 that varies as a function of the supply voltage $V_{DD}-V_{SS}$ so as to be substantially constant from a value of supply voltage $V_{C3}$ lower than $V_{C1}$, said first device D1 including at least a capacitive type voltage divider stage connected on the one hand to a first of said two supply terminals and on the other hand to said input terminal, said voltage divider stage including at least one transistor made in SOI technology including a gate connected to said output terminal of said first electronic device D1, a source and a drain connected to each other and connected to said first supply terminal, said first device D1 also including polarisation means for said transistor connected on the one hand to the second of said two supply terminals and on the other hand to the gate of said transistor, said second electronic device D2 including at least an electronic circuit taken from the group including amplifiers and oscillators with semiconductor components, wherein said first device D1 further includes a second output terminal, a second capacitive type voltage divider stage connected on the one hand to the second of said two supply terminals and on the other hand to said input terminal, wherein said second voltage divider stage includes at least a second transistor of the SOI type whose doping type is different from that of the transistor of said first stage and including a gate connected to said second output terminal, a source and a drain connected to each other and connected to said second supply terminal, wherein said second device D2 also includes polarisation means for said second transistor connected on the one hand to the first of said two supply terminals and on the other hand to the gate of said second transistor, wherein said electronic circuit of the second device D2 includes an input terminal and an output terminal, said input terminal being connected to a first of said two output terminals of said first device D1.

8. The electronic system according to claim 7, further including a third electronic device D3 comprising an electronic circuit selected from the group including amplifiers and oscillators, said electronic circuit including an input terminal and an output terminal, said input terminal being connected to the second of said two output terminals of said first electronic device D1.

9. The electronic system according to claim 8, further including an output stage comprising two input terminals and an output terminal, said input terminals being respectively connected to the output terminal of said first device D1 remaining free and to the output terminal of the second device D2 or respectively to the output terminals of the second and third devices D2 and D3, said output stage performing the recombination of the signals respectively delivered by said two output terminals.

10. The electronic system according to claim 9, wherein said output stage includes at least two transistors whose gates are respectively connected to said input terminals of the output stage, the sources are respectively connected to said supply terminals of the system and the drains are connected to said output terminal of said output stage.

11. A capacitive voltage divider circuit connected on the one hand to an input terminal and on the other hand to a terminal brought to a first reference potential, the circuit including an output terminal and a SOI type transistor comprising a gate connected to said output terminal of the circuit, a source and a drain connected to each other and connected to said terminal brought to said first reference potential, the circuit further including polarisation means for said transistor connected on the one hand to the gate of said transistor and on the other hand to a terminal brought to a second reference potential, wherein said transistor is of the N type, wherein said terminal brought to a first reference potential is a low supply terminal, wherein said terminal brought to a second reference potential is a high supply terminal and wherein said polarisation means for the transistor include a current source and a P type transistor whose source and gate are connected to each other and connected to said current source.

12. A capacitive voltage divider circuit connected on the one hand to an input terminal and on the other hand to a terminal brought to a first reference potential, the circuit including an output terminal and a SOI type transistor comprising a gate connected to said output terminal of the circuit, a source and a drain connected to each other and connected to said terminal brought to said first reference potential, the circuit further including polarisation means for said transistor connected on the one hand to the gate of said transistor and on the other hand to a terminal brought to a second reference potential, wherein said transistor is of the P type, wherein said terminal brought to a first reference potential is a high supply terminal, wherein said terminal brought to a second reference potential is a low supply terminal and wherein said polarisation means of the transistor include a current source and an N type transistor whose drain and gate are connected to each other and connected to said current source.

* * * * *